(12) United States Patent
Lam

(10) Patent No.: US 9,531,068 B2
(45) Date of Patent: Dec. 27, 2016

(54) EFFICIENT LOOP ANTENNA SYSTEM AND METHOD

(75) Inventor: Alan Lam, Hong Kong (CN)

(73) Assignee: General Wireless IP Holdings, LLC, Fort Worth, TX (US)

( * ) Notice: Subject to any disclaimer, the term of this patent is extended or adjusted under 35 U.S.C. 154(b) by 425 days.

(21) Appl. No.: 14/112,185

(22) PCT Filed: Apr. 21, 2011

(86) PCT No.: PCT/CN2011/073130
§ 371 (c)(1),
(2), (4) Date: Oct. 16, 2013

(87) PCT Pub. No.: WO2012/142764
PCT Pub. Date: Oct. 26, 2012

(65) Prior Publication Data
US 2014/0043109 A1    Feb. 13, 2014

(51) Int. Cl.
*H01Q 7/00*     (2006.01)
*H01Q 1/50*     (2006.01)
*H03H 7/38*     (2006.01)

(52) U.S. Cl.
CPC .................. *H01Q 1/50* (2013.01); *H01Q 7/00* (2013.01); *H03H 7/38* (2013.01)

(58) Field of Classification Search
CPC ............... H01Q 1/50; H01Q 7/00; H03H 7/38
See application file for complete search history.

(56) References Cited

U.S. PATENT DOCUMENTS

| | | | |
|---|---|---|---|
| 8,994,600 B2 * | 3/2015 | Schneider | H01Q 19/10 343/741 |
| 2004/0135726 A1 * | 7/2004 | Shamir | H01Q 1/36 343/700 MS |
| 2005/0017907 A1 | 1/2005 | Engargiola | |

(Continued)

FOREIGN PATENT DOCUMENTS

| CN | 1768450 | 5/2006 |
|---|---|---|
| CN | 1108461 | 7/2008 |

(Continued)

OTHER PUBLICATIONS

Chinese Office Action and Search Report with English translation issued for CN 201110204442.4 dated Apr. 2, 2014, 8 pgs.

(Continued)

*Primary Examiner* — Trinh Dinh
(74) *Attorney, Agent, or Firm* — Haynes and Boone, LLP

(57) ABSTRACT

An antenna including a conductive loop having a first top surface portion, the conductive loop having a first edge portion interrupted by a gap defining a feed point, a conductive strip having a second top surface, the conductive loop lying in a plane defined by the second top surface, the conductive strip having a second edge portion extending between first and second opposing distal ends, the second edge portion being spaced from the first edge portion, and the second edge portion extending along the first edge portion at a substantially constant distance from the first edge portion, and wherein the conductive strip is electrically isolated from the conductive loop and is structurally configured and positioned relative to the conductive loop to adjust an input impedance of the conductive loop.

21 Claims, 5 Drawing Sheets

(56) References Cited

U.S. PATENT DOCUMENTS

| | | | | |
|---|---|---|---|---|
| 2007/0182658 A1* | 8/2007 | Ozden | ............ | H01Q 1/243 |
| | | | | 343/866 |
| 2009/0135077 A1* | 5/2009 | Kim | ............ | H01Q 7/00 |
| | | | | 343/843 |
| 2011/0115685 A1* | 5/2011 | Chang | ............ | G06K 19/07749 |
| | | | | 343/793 |
| 2014/0300518 A1* | 10/2014 | Ramachandran | ...... | H01Q 1/243 |
| | | | | 343/702 |

FOREIGN PATENT DOCUMENTS

| | | |
|---|---|---|
| CN | 101233532 | 7/2008 |
| CN | 101009402 | 10/2012 |
| CN | 101950854 | 11/2012 |

OTHER PUBLICATIONS

English Translation of CN 101009402 dated Oct. 31, 2012, 3 pgs.
English Translation of CN 101950854 dated Nov. 7, 2012 4 pgs.
International Search Report issued for PCT/CN2011/073130 dated Jan. 5, 2012, 5 pages.

\* cited by examiner

EFFICIENT LOOP ANTENNA SYSTEM AND METHOD

CROSS-REFERENCE TO RELATED APPLICATION

This application is a United States national phase application of co-pending international patent application number PCT/CN2011/073130, filed Apr. 21, 2011, the disclosure of which is incorporated herein by reference.

BACKGROUND

Conventional indoor television antennas generally include two antennas, a loop antenna for UHF reception and a telescopic antenna for VHF reception. Typically, in such a setup, the UHF loop antenna is paired with a 4:1 balun to match the input impedance of the antenna to that of an amplifier and also to convert a balanced antenna output to an unbalanced amplifier input. Further, although a UHF loop antenna will typically boost received signals by some amount, the television receiver will not receive these enhanced signals because the balun attenuates them somewhat. For example, if the gain of the UHF antenna is about 2 dBi and the signal loss due to the balun is 2 dB, the net signal gain is zero. Further, television signals received by UHF and VHF antennas are usually diplexed before they are transmitted to an amplifier. Filters in the diplexer may further attenuate the signal.

FIG. 1 is a functional block diagram of a conventional indoor television antenna system 100. The system 100 includes two antennas, a 7.5 inch diameter UHF loop antenna 102 and a VHF telescopic antenna 104. The loop antenna 102 receives a UHF signal and boosts it by about 2 dBi. The loop antenna output signal 106 is balanced and has an impedance of about 300 ohms as it is passed to a 4:1 balun 108. The 4:1 balun 108 unbalances and reduces the impedance so that an output signal 110 is unbalanced and has an impedance of about 75 ohms. Further, the 4:1 balun 108 attenuates the antenna output signal 106 by about 2 dB as it passes through.

The telescopic antenna 104 receives and sends a balanced VHF signal to a 1:1 balun 112. The 1:1 balun outputs an unbalanced output signal 114. The UHF output signal 110 and the VHF output signal 114 are then passed, through a diplexer 116, where the UHF signal is attenuated further by a high-pass filter. The unbalanced signals 110 and 114 are then passed through an unbalanced amplifier 118 that is powered by a power injector 120. Finally, the UHF and VHF signals are received by a television receiver 122. Because of the signal loss inherent in the television antenna system 100, the television picture produced by the UHF signal is often not entirely satisfactory.

While existing devices, for example those described above, have been generally adequate for their intended purposes, they have not been entirely satisfactory in all respects. The embodiments of the present disclosure overcome one or more of the shortcomings of the prior art.

SUMMARY

In one exemplary aspect, the present disclosure is directed to an antenna. The antenna may include a conductive loop having a first top surface and a first bottom surface, the first top surface and the first bottom surface being separated by a first thickness, the conductive loop having a first edge portion interrupted by a gap defining a feed point, and the conductive loop being responsive to electromagnetic signals in a frequency band. The antenna may also include a conductive strip having a second top surface and a second bottom surface, the second top surface and the second bottom surface being separated by a second thickness substantially similar to the first thickness, the conductive loop lying in a plane defined by the second top surface, the conductive strip having a first distal end and an opposing second distal end and a second edge portion extending between the first and second distal ends, the second edge portion being spaced from the first edge portion, and the second edge portion extending along the first edge portion at a substantially constant distance from the first edge portion. The conductive strip may be electrically isolated from the conductive loop and may be structurally configured and positioned relative to the conductive loop to adjust an input impedance of the conductive loop.

In some instances, the second top surface may be substantially coplanar with the first top surface such that the second edge portion opposes the first edge portion.

In other instances, the second top surface may be substantially perpendicular to the first top surface such that the second edge portion opposes the first top surface.

In other instances, the first edge portion may be substantially parallel to the second edge portion.

In other instances, the first and second edge portions may be curved and substantially concentric about an axis and wherein the conductive loop is a circle loop.

In another exemplary aspect, the present disclosure is directed to an antenna system. The antenna system may include a conductive loop having a feed point portion with a first terminal and a second terminal, the conductive loop having a balanced output and a first input impedance. The antenna system may also include an amplifier having a third terminal electrically coupled to the first terminal and a fourth terminal electrically coupled to the second terminal, the amplifier having a balanced input and a second input impedance, wherein the first, second, third, and fourth terminals form a balanced transmission line between the conductive loop and the amplifier. The antenna system may further include a conductive strip adjacent to and spaced from the feed point portion of the conductive loop, the conductive strip being electrically isolated from the loop antenna and being structurally configured and positioned relative to the conductive loop to adjust the first input impedance of the conductive loop to substantially match the second input impedance of the amplifier. The antenna system may additionally include a housing structurally configured to house the conductive loop, the amplifier, and the conductive strip.

In some instances, the conductive loop includes a first top surface with the feed point portion therein and the conductive strip includes a second top surface that is substantially coplanar with the first top surface.

In other instances, the conductive loop includes a feed point surface with the feed point portion therein and the conductive strip includes a top surface that is substantially perpendicular to the feed point surface.

In other instances, the conductive loop includes a first edge portion interrupted by a gap defining the feed point portion and the conductive strip includes a first distal end and an opposing second distal end and a second edge portion extending between the first and second distal ends. The second edge portion may be opposed to and spaced from the first edge portion, the second edge portion extending along the first edge portion at a substantially constant distance from the first edge portion.

In another exemplary aspect, the present disclosure is directed to a method of receiving television signals. The method may include receiving electromagnetic signals using a conductive loop having a first input impedance and a first edge portion interrupted by a gap defining a feed point. The method may also include transmitting the electromagnetic signals from the conductive loop to an amplifier having a second input impedance over a balanced transmission line electrically coupled to the feed point portion of the conductive loop. The method may further include substantially matching the first input impedance of the conductive loop with the second input impedance of the amplifier using an electrically isolated conductive strip adjacent to and spaced from the feed point portion of the conductive loop, the conductive strip having a second edge portion spaced from and opposing the first edge portion, and the second edge portion extending along the first edge portion at a substantially constant distance.

In some instances, the substantially matching may include adjusting the first input impedance of the conductive loop from approximately 300 ohms to approximately 75 ohms.

In other instances, the conductive loop may include a first top surface with the feed point therein and the conductive strip may include a second top surface that is substantially coplanar with the first top surface.

DETAILED DESCRIPTION

Figure 1:
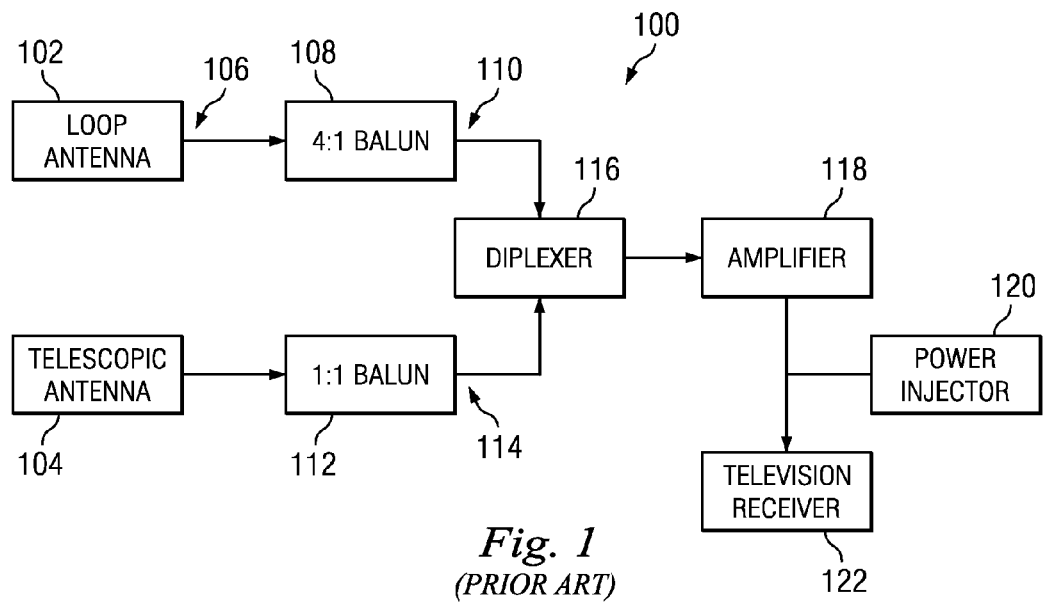
FIG. 1 is a functional block diagram of a conventional indoor television antenna system.

For the purposes of promoting an understanding of the principles of the present disclosure, reference will now be made to the embodiments illustrated in the drawings, and specific language will be used to describe the same. It will nevertheless be understood that no limitation of the scope of the disclosure is intended. Any alterations and further modifications in the described devices, instruments, methods, and any further application of the principles of the disclosure as described herein are contemplated as would normally occur to one skilled in the art to which the disclosure relates. In particular, it is fully contemplated that the features, components, and/or steps described with respect to one embodiment may be combined with the features, components, and/or steps described with respect to other embodiments of the present disclosure.

As described above, conventional antenna systems typically include a 4:1 balun to match the input impedance of a loop antenna with the input impedance of an amplifier. Exemplary antenna systems according to the present disclosure do not include a 4:1 balun to impedance match, and thus avoid the signal attenuation typically imposed by a balun. Instead, the exemplary antenna systems described herein utilize an impedance matching technique that involves positioning a conductive matching strip near the conductive loop of a loop antenna. These conductive matching strips are electrically isolated from their associated loop antennas and reduce the input impedance of the antennas to match that of the downstream amplifiers. Therefore, the exemplary antenna systems according to the present disclosure may produce a stronger television signal than conventional systems and do so in a more efficient manner.

Figure 2:
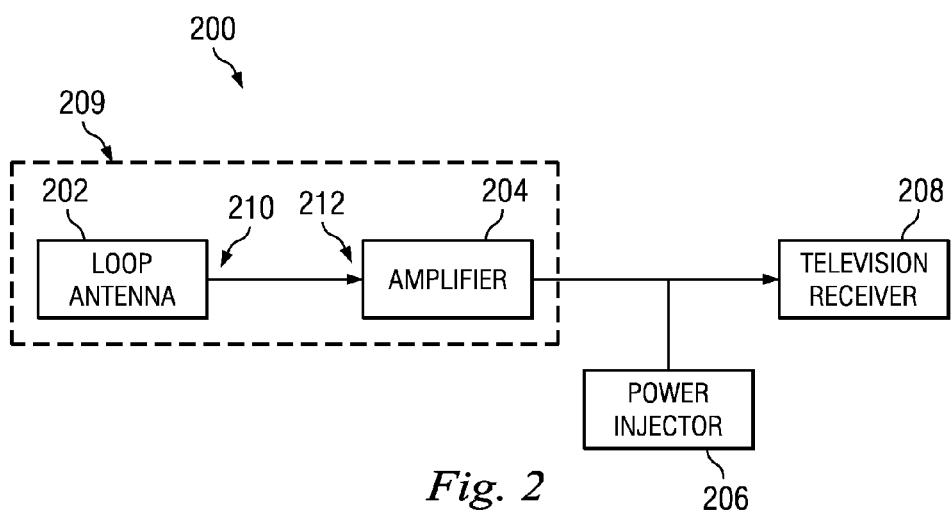
FIG. 2 is a functional block diagram of a television antenna system according to one exemplary aspect of the present disclosure.

FIG. 2 is a functional block diagram of a television antenna system 200 according to one exemplary aspect of the present disclosure. The television antenna system 200 includes a UHF loop antenna 202, an amplifier 204, a power injector 206 to power the amplifier, and a television receiver 208. In the illustrated embodiment, the loop antenna 202 and the amplifier 204 are contained in a housing 209, but, in alternative embodiments, the antenna and amplifier may be spaced apart in different housings. Note that a patent application entitled "Configurable Antenna System and Method" filed on Apr. 21, 2011 having been assigned U.S. application Ser. No. 14/112,145, discloses an antenna system with a housing and is hereby incorporated by reference in its entirety. The loop antenna 202 is operable to receive digital television signals with wavelengths between approximately 470 MHz and 725 MHz. In other embodiments, however, the loop antenna 202 may be operable to receive TV signals in other wavelength ranges. Additionally, in the illustrated embodiment, the loop antenna 202 has a gain of approximately 2 dBi, but alternatively, it may have a smaller or larger gain. The loop antenna 202 further has a balanced output and an input impedance 210. The loop antenna 202 will be described in greater detail in association with FIG. 3. As shown in FIG. 2, the loop antenna 202 sends received UHF signals to an amplifier 204. The amplifier 204 is a low noise amplifier operable to amplify the UHF signals received from the loop antenna 202. The amplifier 204 has a balanced input and an input impedance 212. As shown in FIG. 2, the amplifier transmits the amplified UHF signal to the television receiver 208 where it is decoded to produce a television picture.

Notably, the input impedance 210 of the loop antenna 202 matches the input impedance 212 of the amplifier 204. In the illustrated embodiment, the input impedance 210 is approximately 75 ohms and the input impedance 212 is also approximately 75 ohms. In alternative embodiments, the input impedance of the amplifier may be approximately 50 ohms and the input impedance of the loop may be adjusted accordingly by a matching strip (described below) to match it. Thus, because both the loop antenna 202 and the amplifier 204 have approximately the same input impedances and both are balanced circuits, no balun is required between the loop antenna and amplifier. That is, electromagnetic signals may be passed directly from the loop antenna to the amplifier over a balanced transmission line. As a result, the approximately 2 dBi gain of the loop antenna 202 is passed to the amplifier 204 without being attenuated by a balun. In this manner, the UHF signal passed to the television receiver 208 may be improved by at least 2 dB. Although input impedances of approximately 75 ohms and 50 ohms are described above, other input impedances, both higher and lower, are contemplated.

Figure 3:
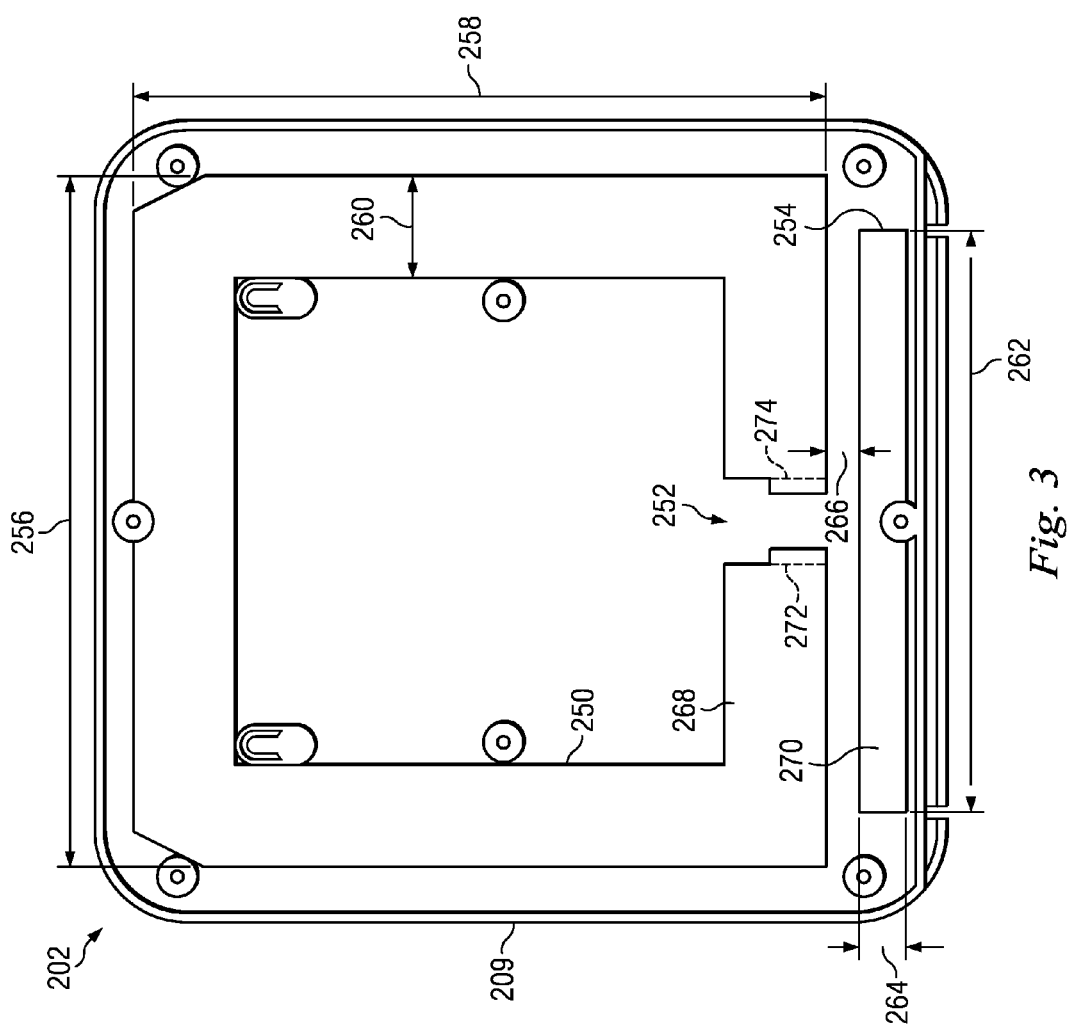
FIG. 3 is a schematic drawing of the planar loop antenna of FIG. 2 according to one exemplary embodiment of the present disclosure.

FIG. 3 is a schematic drawing of the planar loop antenna 202 of FIG. 2 according to one exemplary embodiment of the present disclosure. The loop antenna 202 includes a conductive loop 250 with a feed point 252 and a conductive matching strip 254, both of which are housed in housing 209. In the current embodiment, the amplifier 204 is also housed in the housing 209, but, for the sake of clarity, the amplifier is not shown in FIG. 3. The matching strip 254 is electrically isolated from the loop 250 by a dielectric, for example, air. In general, by virtue of its position with respect to the loop 250, the matching strip 254 is operable to lower the input impedance 210 of the antenna 202 so that it approximately matches the input impedance 212 of the amplifier 204.

In more detail, in the illustrated embodiment, the loop 250 and the matching strip 254 are sheets of 0.2 mm thick zinc metal, but, in other embodiments they may be another conductive metal such as, for example, copper or aluminum or an alloy and may be of a different thickness. It should be noted that the conductive metal may be any conductive metal, and is not limited to those explicitly referenced here. The loop 250 has a width 256 and a height 258, which, in the illustrated embodiment are both 190.5 mm (i.e. loop 250 is a square loop). Further, the conductive portion of the loop 250 has a width 260, which, in the illustrated embodiment is 28.575 mm. Further, the matching strip 254 has a length 262 and a height 264, which, in the illustrated embodiment are respectively 158.75 mm and 12.7 mm. With respect to the orientation of the matching strip 254 relative to the loop 250, an edge of the matching strip extends in a parallel manner along an opposing edge of the loop 250 that contains the feed input 252. In other words, all points along the edge of the matching strip 254 are spaced from opposing points on the feed point edge of the loop by an equal distance 266. In the illustrated embodiment, the distance 266 between the matching strip 254 and the loop 250 is 12.7 mm. Further, a planar surface 268 of loop 250 and a planar surface 270 of the matching strip 254 are aligned along the same plane (i.e. coplanar) within the housing 209. A gap in the planar surface 268 defines the feed point 252. In the illustrated embodiment, contact points (terminals) 272 and 274 are disposed on either side of the feed point 252 and electrically couple the loop 250 to the amplifier 204.

As mentioned above, the matching strip 254 is operable to affect the input impedance of the loop 250. More specifically, the placement of the matching strip 254 near the loop 250 disturbs the distribution of the loop's magnetic field and, in turn, affects the loop's impedance. In the illustrated embodiment, the placement of the matching strip 254 12.7 mm below the feed-input 252 of the loop 250 lowers the loop's inherent impedance of approximately 300 ohms to approximately 75 ohms. The structural characteristics of the matching strip 254 and its position and orientation relative to the loop 250 determine the amount of disturbance to the loop's magnetic field. Thus, changing at least one of the distance of the matching strip 254 from the loop 250, the orientation of the loop's planar surface 268 with respect to the strip's planar surface 270, the length 262 of the matching strip, and the height 264 of the matching strip may affect the input impedance 210 of the antenna 202.

Figure 4:
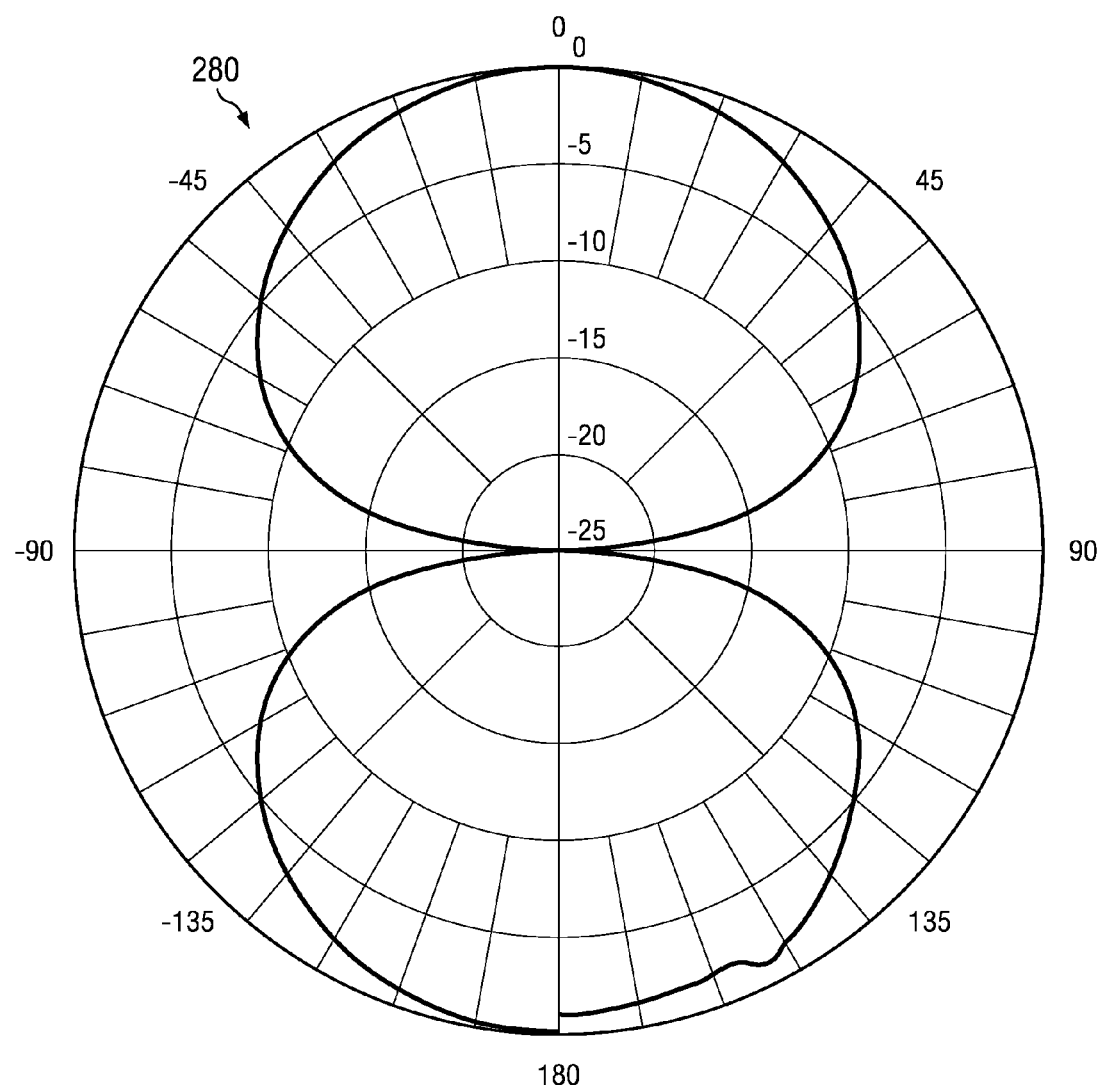
FIG. 4 is an illustration of an example antenna reception pattern of the planar loop antenna of FIG. 3.

Further, the placement of the matching strip 254 near the loop 250 does not significantly alter the antenna reception pattern with respect to conventional loop antennas. In the illustrated embodiment, the antenna 202 is "omni-directional" and has a "figure 8" antenna pattern at UHF frequencies. For example, at 589 MHz, the loop antenna 202 has a "figure 8" antenna pattern 280 shown in FIG. 4.

Figure 5:
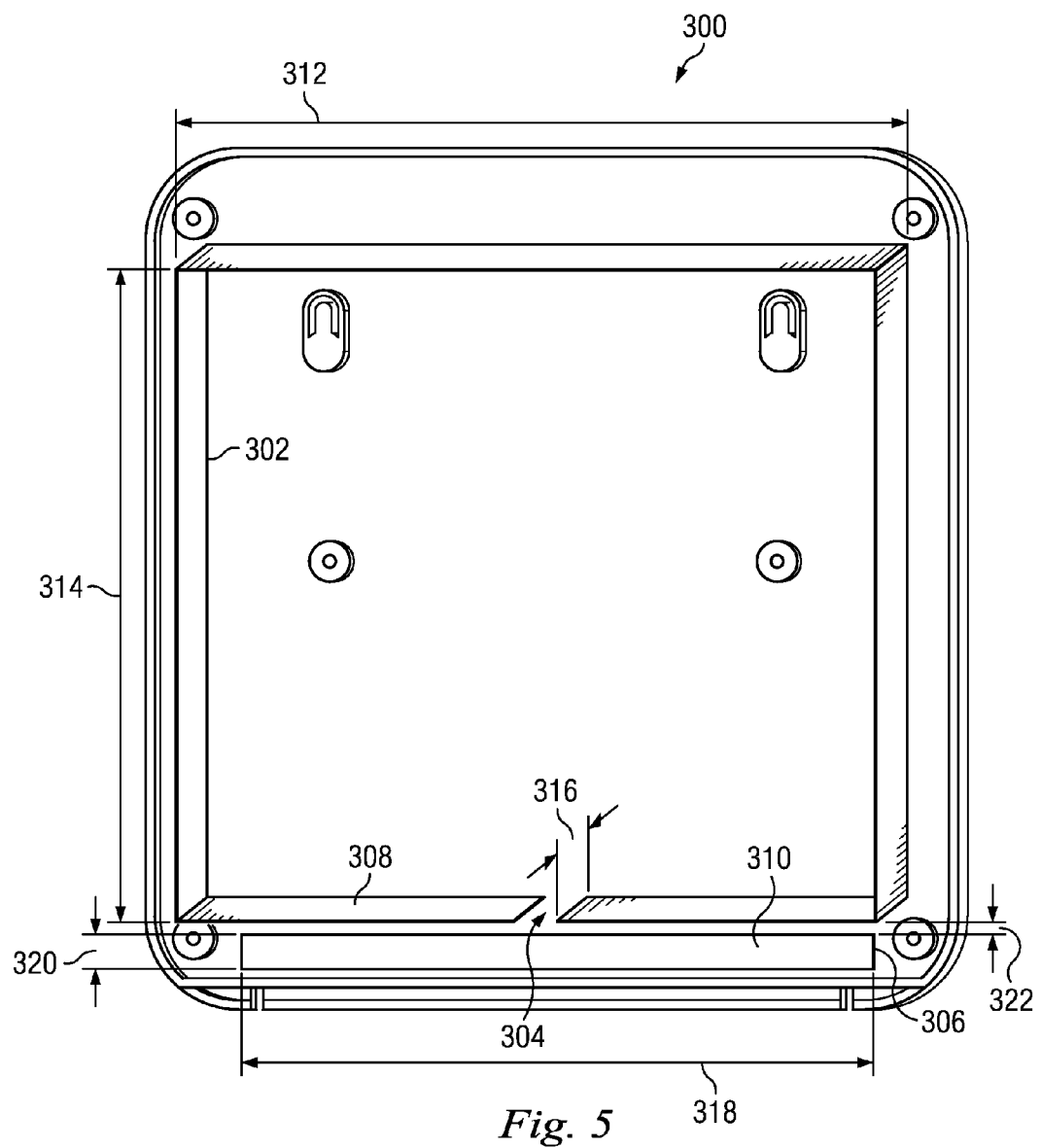
FIG. 5 is a schematic drawing of a loop antenna according to another exemplary embodiment of the present disclosure.

The impedance matching technique using a conductive matching strip as described above is not limited to the loop and strip configuration shown in FIG. 3. For example, with reference now to FIG. 5, illustrated is a schematic drawing of a loop antenna 300 according to another exemplary embodiment of the present disclosure. Like the loop antenna 202 of FIG. 3, the loop antenna 300 includes a conductive loop 302 with a feed point 304 and a conductive matching strip 306 that is electrically isolated from the loop 302 by air. And, like the matching strip 254 of FIG. 3, the matching strip 306 is operable to lower the input impedance of the antenna 300 so that it approximately matches the input impedance of a down-stream balanced amplifier. However, in the embodiment of FIG. 5, the matching strip 306 is not co-planar with the loop 302. Specifically, the loop 302 includes a planar feed point surface 308 with a gap that defines the feed point 304. And, as illustrated in FIG. 5, the matching strip 306 includes a planar surface 310 that is approximately perpendicular to the planar surface 308 in loop 302. As such, the plane defined by the planar surface 310 of the matching strip 306 passes through the conductive loop 302.

In more detail, in the illustrated embodiment, the loop 302 and the matching strip 306 are sheets of 0.2 mm thick zinc metal, but, in other embodiments they may be another conductive metal such as, for example, copper or aluminum or an alloy and may be of a different thickness. It should be noted that the conductive metal may be any conductive metal, and is not limited to those explicitly referenced here. The loop 302 has a width 312 and a height 314, which, in the illustrated embodiment are both 177.8 mm (i.e. loop 302 is a square loop). Further, the planar conductive surface 308 of the loop 302 has a depth 316, which, in the illustrated embodiment is 6 mm. Further, the matching strip 306 has a length 318 and a height 320 (of planar surface 310), which, in the illustrated embodiment are 165.1 mm and 12 mm, respectively. With respect to the orientation of the matching strip 306 to the loop 302, an edge of the matching strip extends in a parallel manner along the surface 308 of the loop. More specifically, all points along the edge of the matching strip 306 are spaced from the opposing points on the surface 308 by an equal distance 322. In the illustrated embodiment, the distance 322 between the matching strip 306 and the loop 302 is 3 mm. Additionally, the antenna reception pattern for the antenna 300 is omni-directional and similar to the "figure 8" pattern shown in FIG. 4. Further, contact points (terminals) may be disposed on either side of the feed point 304 to electrically couple the loop 302 to an amplifier, such as amplifier 204 in FIG. 2.

The impedance matching technique using a conductive matching strip is also not limited to square loop antennas, such as antennas 202 and 300 shown in FIGS. 3 and 5. This impedance matching technique may be used with other shape loop antennas, such as rectangle loop antennas and circle loop antennas.

Figure 6:
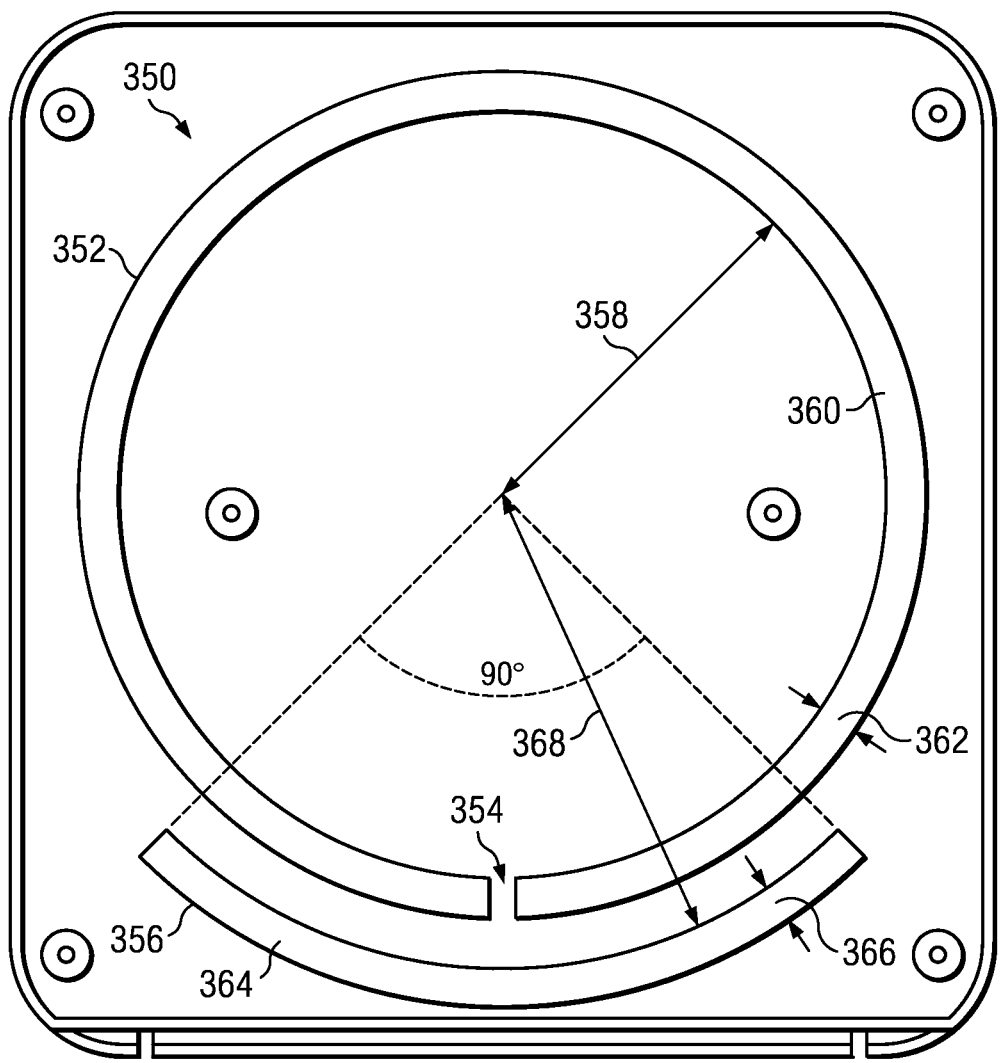
FIG. 6 is a schematic drawing of a circle loop antenna according to another exemplary embodiment of the present disclosure.

With reference now to FIG. 6, illustrated is a schematic drawing of a circle loop antenna 350 according to another exemplary embodiment of the present disclosure. Like the loop antenna 202 of FIG. 3, the loop antenna 350 includes a conductive loop 352 with a feed point 354 and a conductive matching strip 356 that is electrically isolated from the loop 352 by air. And, like the matching strip 254 of FIG. 3, the matching strip 356 is operable to lower the input impedance of the loop 352 so that it approximately matches the input impedance of a balanced amplifier electrically coupled to terminals on the feed point 354.

In more detail, in the illustrated embodiment, the loop 352 and the matching strip 356 are sheets of 0.2 mm thick zinc metal, but, in other embodiments they may be another conductive metal such as, for example, copper or aluminum or an alloy and may be of a different thickness. It should be noted that the conductive metal may be any conductive metal, and is not limited to those explicitly referenced here. The loop 352 has an interior radius 358, which, in the illustrated embodiment is 172.5 mm. Further, the loop 302 has a planar surface 360 of width 362, which, in the illustrated embodiment is 18 mm. The matching strip 356 has a planar surface 364 of width 366, which, in the illustrated embodiment is 16 mm. Further, the matching strip is a semi-circle with interior radius 368 as measured from the same center point (axis) as the loop 352. In the illustrated embodiment, the interior radius 368 is 212.5 mm. With respect to the orientation of the matching strip 356 to the loop 352, an edge of the matching strip and an opposing edge of the loop containing the feed point 354 are substantially concentric. In other words, all points along the edge of the matching strip are equidistant from opposing points along the outside edge of loop 352. Specifically, in the illustrated embodiment, the matching strip 356 extends 90° about the center point of the loop 352 and, by virtue of its radius 368, is spaced from the loop by 22 mm. Further, a planar surface 360 of loop 352 and a planar surface 364 of the matching strip 356 are aligned along the same plane (i.e. coplanar). A gap in the planar surface 360 defines the feed point 354. Contact points (terminals) may be disposed on either side of the feed point 354 to electrically couple the loop 352 to an amplifier, such as amplifier 204 in FIG. 2.

Although illustrative embodiments have been shown and described, wide ranges of modifications, changes, and substitutions are contemplated in the foregoing disclosure and in some instances, some features of the present disclosure may be employed without a corresponding use of the other features. For example, in some embodiments, the components of an antenna according to the present disclosure may have different dimensions than the antennas shown in FIGS. 3, 5, and 6. And, the matching strips in some embodiments may be oriented and positioned relative to their associated loops in a different manner than in the described embodiments. For example, the matching strips may lie in a plane oblique to the loop. Further, the impedance matching technique described herein may be applied in different types of antenna systems, such as outdoor antenna systems, commercial antenna systems, large scale antenna systems, and any other antenna systems that would benefit from impedance matching without the use of a balun. It is understood that such variations may be made in the foregoing without departing from the scope of the present disclosure. Accordingly, it is appropriate that the appended claims be construed broadly and in a manner consistent with the scope of the present disclosure.

What is claimed is:

1. A television (TV) antenna, comprising,
a conductive loop having a first top surface and a first bottom surface, the first top surface and the first bottom surface being separated by a first thickness, the conductive loop having a first edge portion interrupted by a gap defining a feed point, and the conductive loop being responsive to electromagnetic signals in a frequency band for receiving TV signals; and
a conductive strip having a second top surface and a second bottom surface, the second top surface and the second bottom surface being separated by a second thickness substantially similar to the first thickness, the conductive loop lying in a plane defined by the second top surface, the conductive strip having a first distal end and an opposing second distal end and a second edge portion extending between the first and second distal ends, the second edge portion being spaced from the first edge portion, and the second edge portion extending along the first edge portion at a substantially constant distance from the first edge portion;
wherein the conductive strip is electrically isolated from the conductive loop and is structurally configured and positioned relative to the conductive loop to adjust an input impedance of the conductive loop, wherein the conductive loop is one of a square loop and a rectangular loop.

2. The TV antenna of claim 1, wherein the second top surface is substantially coplanar with the first top surface such that the second edge portion opposes the first edge portion.

3. The TV antenna of claim 1, wherein the second top surface is substantially perpendicular to the first top surface such that the second edge portion opposes the first top surface.

4. The TV antenna of claim 1, wherein the conductive strip includes one of zinc, copper, and aluminum; and wherein the conductive loop includes one of zinc, copper, and aluminum.

5. The TV antenna of claim 1, wherein the first edge portion is substantially parallel to the second edge portion.

6. The TV antenna of claim 1, wherein the frequency band ranges from approximately 470 MHz to 725 MHz.

7. The TV antenna of claim 1, wherein the conductive strip is structurally configured and positioned relative to the conductive loop to adjust the input impedance of the conductive loop from approximately 300 ohms to approximately 75 ohms.

8. A system, comprising:
a Television (TV) antenna configured to receive TV signals, wherein the TV antenna includes:
a conductive loop having a first top surface and a first bottom surface, the first top surface and the first bottom surface being separated by a first thickness, the conductive loop having a first edge portion interrupted by a gap defining a feed point, and the conductive loop being responsive to electromagnetic signals in a TV frequency band, wherein the conductive loop is a square loop or a rectangular loop; and
a conductive strip having a second top surface and a second bottom surface, the second top surface and the second bottom surface being separated by a second thickness substantially similar to the first thickness, the conductive loop lying in a plane defined by the second top surface, the conductive strip having a first distal end and an opposing second distal end and a second edge portion extending between the first and second distal ends, the second edge portion being spaced from the first edge portion, and the second edge portion extending along the first edge portion at a substantially constant distance from the first edge portion;
wherein the conductive strip is electrically isolated from the conductive loop and is structurally configured and positioned relative to the conductive loop to adjust an input impedance of the conductive loop.

9. The system of claim 8, wherein the second top surface is substantially coplanar with the first top surface such that the second edge portion opposes the first edge portion.

10. The system of claim 8, wherein the second top surface is substantially perpendicular to the first top surface such that the second edge portion opposes the first top surface.

11. The system of claim 8, wherein the conductive strip includes one of zinc, copper, and aluminum; and wherein the conductive loop includes one of zinc, copper, and aluminum.

12. The system of claim 8, wherein the first edge portion is substantially parallel to the second edge portion.

13. The system of claim 8, wherein the frequency band ranges from approximately 470 MHz to 725 MHz.

14. The system of claim 8, wherein the conductive strip is structurally configured and positioned relative to the conductive loop to adjust the input impedance of the conductive loop from approximately 300 ohms to approximately 75 ohms.

15. The system of claim 8, further comprising an amplifier coupled to the TV antenna.

16. A system, comprising:
- a Television (TV) antenna configured to receive TV signals, wherein the TV antenna includes:
  - a conductive loop having a first top surface and a first bottom surface, the first top surface and the first bottom surface being separated by a first thickness, the conductive loop having a first edge portion interrupted by a gap defining a feed point, and the conductive loop being responsive to electromagnetic signals in a TV frequency band, wherein the conductive loop is a square loop or a rectangular loop; and
  - a conductive strip having a second top surface and a second bottom surface, the second top surface and the second bottom surface being separated by a second thickness substantially similar to the first thickness, the conductive loop lying in a plane defined by the second top surface, the conductive strip having a first distal end and an opposing second distal end and a second edge portion extending between the first and second distal ends, the second edge portion being spaced from the first edge portion, and the second edge portion being parallel to the first edge portion;
  - wherein the conductive strip is electrically isolated from the conductive loop and is structurally configured and positioned relative to the conductive loop to adjust an input impedance of the conductive loop; and
- an amplifier coupled to the TV antenna.

17. The system of claim 16, wherein the second top surface is substantially coplanar with the first top surface such that the second edge portion opposes the first edge portion.

18. The system of claim 16, wherein the second top surface is substantially perpendicular to the first top surface such that the second edge portion opposes the first top surface.

19. The system of claim 16, wherein the conductive strip includes one of zinc, copper, and aluminum; and wherein the conductive loop includes one of zinc, copper, and aluminum.

20. The system of claim 16, wherein the frequency band ranges from approximately 470 MHz to 725 MHz.

21. The system of claim 16, wherein the conductive strip is structurally configured and positioned relative to the conductive loop to adjust the input impedance of the conductive loop from approximately 300 ohms to approximately 75 ohms.

* * * * *